(12) United States Patent
Morris et al.

(10) Patent No.: US 10,693,427 B2
(45) Date of Patent: Jun. 23, 2020

(54) HIGH-EFFICIENCY AMPLIFIER

(71) Applicant: Airbus Defence and Space Limited, Hertfordshire (GB)

(72) Inventors: Ian Morris, Portsmouth Hants (GB); Nigel Wheatley, Portsmouth Hants (GB); Nicolas Celerier, Portsmouth Hants (GB)

(73) Assignee: Airbus Defence and Space Limited, Hertfordshire (GB)

( * ) Notice: Subject to any disclaimer, the term of this patent is extended or adjusted under 35 U.S.C. 154(b) by 0 days.

(21) Appl. No.: 15/769,874

(22) PCT Filed: Oct. 21, 2016

(86) PCT No.: PCT/GB2016/053307
§ 371 (c)(1),
(2) Date: Apr. 20, 2018

(87) PCT Pub. No.: WO2017/068373
PCT Pub. Date: Apr. 27, 2017

(65) Prior Publication Data
US 2018/0316326 A1   Nov. 1, 2018

(30) Foreign Application Priority Data
Oct. 23, 2015 (GB) .................................. 1518859.2

(51) Int. Cl.
*H03F 3/58* (2006.01)
*H03F 3/68* (2006.01)
(Continued)

(52) U.S. Cl.
CPC .............. *H03F 3/58* (2013.01); *H01Q 1/288* (2013.01); *H01Q 21/22* (2013.01); *H03F 1/06* (2013.01);
(Continued)

(58) Field of Classification Search
CPC ....................................................... H03F 3/58
(Continued)

(56) References Cited

U.S. PATENT DOCUMENTS 5,200,708 A * 4/1993 Morris, Jr. ................ H03F 3/68
                                                      330/124 R
5,302,914 A * 4/1994 Arntz ........................ H03F 1/34
                                                      330/124 R
(Continued)

FOREIGN PATENT DOCUMENTS

EP   0125218 A2   11/1984
EP   0662775 A1    7/1995
(Continued)

OTHER PUBLICATIONS

"International Application No. PCT/GB2016/053307, International Search Report dated Jan. 18, 2017", (Jan. 18, 2017), 3 pgs.
(Continued)

*Primary Examiner* — Henry Choe
(74) *Attorney, Agent, or Firm* — Schwegman Lundberg & Woessner, P.A.

(57) ABSTRACT

There is provided an electronic amplification apparatus (40) comprising a travelling wave tube amplifier (20) and a limiter (10), wherein the configuration of the amplifier (20) is optimised whilst maintaining signal linearity for operation with improved DC power efficiency at an operating point below saturation, and the limiter (10) is arranged to prevent the output power of the amplifier from going beyond a predetermined limit. This can prevent possible damage. There is also provided a multiport amplifier system (50) containing the electronic amplification apparatus (40), and a multi-feed, multi-amplifier phased array type antenna system (130) containing the electronic amplification apparatus (40), and a satellite communications system comprising the electronic amplification apparatus (40) or the multiport
(Continued)

amplifier system (50) or the multi-feed, multi-amplifier phased array type antenna system (130).

17 Claims, 5 Drawing Sheets

(51) Int. Cl.
  *H03F 3/60* (2006.01)
  *H01Q 1/28* (2006.01)
  *H01Q 21/22* (2006.01)
  *H03F 1/06* (2006.01)
  *H03F 3/189* (2006.01)
  *B64G 1/66* (2006.01)

(52) U.S. Cl.
  CPC ............ *H03F 3/189* (2013.01); *H03F 3/604* (2013.01); *H03F 3/68* (2013.01); *B64G 1/66* (2013.01); *H03F 2200/258* (2013.01); *H03F 2200/451* (2013.01)

(58) Field of Classification Search
  USPC ........................ 330/43, 44, 49, 126
  See application file for complete search history.

(56) References Cited

U.S. PATENT DOCUMENTS

| | | | | |
|---|---|---|---|---|
| 5,955,920 | A * | 9/1999 | Reudink | H03F 3/602 330/124 D |
| 6,243,038 | B1 * | 6/2001 | Butler | H01Q 3/26 330/124 R |
| 6,369,648 | B1 * | 4/2002 | Kirkman | H03F 1/0205 330/140 |
| 6,396,648 | B1 | 5/2002 | Yamamoto et al. | |
| 6,466,088 | B1 * | 10/2002 | Rezvani | H04L 12/10 330/124 R |
| 7,138,862 | B2 * | 11/2006 | Araki | H03F 1/0277 330/126 |
| 7,440,733 | B2 * | 10/2008 | Maslennikov | H03F 1/0227 330/10 |
| 7,498,878 | B2 * | 3/2009 | Lim | H03F 1/0288 330/124 R |
| 7,961,045 | B2 * | 6/2011 | Morris | H03F 1/0288 330/149 |
| 8,718,580 | B2 * | 5/2014 | Borodulin | H03F 1/0277 455/127.1 |
| 8,923,438 | B1 * | 12/2014 | Taft | H04L 25/497 375/308 |
| 2005/0227644 | A1 * | 10/2005 | Maslennikov | H03F 1/0227 455/127.1 |
| 2010/0148860 | A1 * | 6/2010 | Rhodes | H03F 3/602 330/2 |
| 2011/0069516 | A1 * | 3/2011 | Greene | H02J 1/10 363/126 |
| 2012/0133216 | A1 * | 5/2012 | Amma | H02J 5/005 307/104 |
| 2013/0070870 | A1 * | 3/2013 | Pashay-Kojouri | H03F 3/193 375/296 |
| 2014/0118062 | A1 | 5/2014 | Mouchon et al. | |
| 2014/0285262 | A1 | 9/2014 | Kojima et al. | |
| 2016/0094091 | A1 * | 3/2016 | Shin | H02J 17/00 307/104 |
| 2016/0204643 | A1 * | 7/2016 | Manova-Elssibony | H04B 5/0037 320/108 |

FOREIGN PATENT DOCUMENTS

| | | |
|---|---|---|
| EP | 2445102 A1 | 4/2012 |
| EP | 2709272 A1 | 3/2014 |
| GB | 1273956 A | 5/1972 |
| JP | 61146004 A | 7/1986 |

OTHER PUBLICATIONS

"International Application No. PCT/GB2016/053307, Written Opinion dated Jan. 18, 2017", (Jan. 18, 2017), 5 pgs.
"United Kingdom Application No. 1518859.2, Search Report dated Apr. 25, 2016", (Apr. 25, 2016), 5 pgs.
Katz, Allen, "TWTA linearization", Microwave Journal 39.4, (1996), 78-91.

* cited by examiner

HIGH-EFFICIENCY AMPLIFIER

PRIORITY APPLICATIONS

This application is a U.S. National Stage Filing under 35 U.S.C. 371 from International Application No. PCT/GB2016/053307, filed on Oct. 21, 2016, and published as WO2017/068373 on 27 Apr. 2017, which claims the benefit of priority to United Kingdom Application No. 1518859.2, filed on Oct. 23, 2015; the benefit of priority of each of which is hereby claimed herein, and which applications and publication are hereby incorporated herein by reference in their entirety.

TECHNICAL FIELD

The present invention relates to electronic signal amplification, and particularly, but not exclusively, to a high-efficiency multiport amplifier.

BACKGROUND ART

FIG. 1 illustrates a typical power transfer curve for a signal amplifier, showing output power $P_o$ as a function of input power $P_i$. The amplifier has a linear operating region, in which an increase in input power causes a corresponding proportional increase in output power. Saturation is reached where the amplifier is no longer able to generate an increasing output as the input continues to increase. Shortly before saturation, the gradient of the transfer curve may already start to reduce from the gradient in the linear region, but this can be considered to remain part of the "linear region", linearity representing a fixed gradient within a particular tolerance dependent on the application of the amplifier. As the input power increases above saturation, output power may eventually start to decrease as certain secondary effects, specific to the amplifier, begin to arise.

Conventionally, it has been desirable to operate the amplifier at a point on the power transfer curve as close as possible to saturation, since this is associated with maximum signal output power. The amplifier is therefore at its most efficient, in terms of DC power, close to saturation. The operating point of the amplifier can be controlled by controlling the input signal power, potentially using forms of automatic leveling. However, signal distortion is increased at higher power outputs because of non-linearity in the amplifier gain.

Consequently, amplifier configurations typically involve a trade-off between DC efficiency and signal distortion levels. Usually, a compromise is achieved, at which the amplifier is operated below saturation by a certain amount in order to preserve signal quality in a particular application. The movement away from saturation is referred to as the "back-off" of the amplifier, and is a measure of how much the output power must be reduced by in order to achieve the desired characteristics of the output signal. The degree of back-off can thus vary with particular applications, depending on the desired output signal quality.

The disadvantage of this configuration is that the amplifier is not operating at optimum efficiency, the "off-the shelf" configuration of the amplifier being for optimisation at the saturation point of the amplifier as described above. This can be particularly disadvantageous in, for example, satellite communications systems where DC power consumption, dissipation of heat and signal power are crucial design considerations, and sub-optimal operation can be particularly costly.

In multiport amplifier (MPA) systems, for example, which potentially comprise of a large number of amplifier paths between an input network and an output network, and where each amplifier is operating with a large number of signals, it is particularly important to avoid unwanted intermodulation interference but to back off each of the amplifiers from saturation will significantly compromise the overall efficiency of the MPA, reducing performance and suitability for use in space. Similarly, for direct radiating phased array type antennas and phased array fed reflector type antennas, where multiple amplifiers are used in order to amplify signals for each antenna element, all of the amplifiers will be running at less than optimum efficiency.

The present invention aims to improve the DC power efficiency performance of such amplifier systems whilst maintaining the overall signal linearity at the chosen operating point.

SUMMARY OF INVENTION

According to an aspect of the present invention, there is provided an electronic amplification apparatus comprising a travelling wave tube amplifier (TWTA), and a limiter, wherein the configuration of the amplifier is optimised for operation at an operating point below saturation, and the limiter is arranged to prevent the output power of the amplifier from going beyond a predetermined limit.

The limiter may be arranged to restrict operation of the amplifier to a point below saturation.

The limiter may be arranged to limit the power of an input signal to the amplifier to below a predetermined threshold.

The limiter may be arranged to limit a parameter of the TWTA, or of an electronic power conditioner, EPC, of the TWTA, below a predetermined threshold.

The parameter of the EPC may be a voltage or current of the EPC.

The limiter may have near instantaneous response with respect to variations in the input signal to the electronic amplification apparatus.

According to another aspect of the present invention, there is provided a multiport amplifier, MPA, system comprising an input stage for receiving a plurality of signal inputs, an output stage for providing a plurality of signal outputs, an amplification stage for amplifying the plurality of signals received at the input stage and providing the plurality of amplified signals to the output stage and one or more of the above-described electronic amplification apparatuses, wherein the amplification stage contains one or more amplifiers of the respective one or more electronic apparatuses.

One or more limiters of the respective one or more amplifiers may be arranged prior to the input stage, or in the amplification stage.

The amplifier system may further comprise a lineariser stage in the amplification stage to improve the linearity of each of the signal paths between the input stage and the output stage, wherein the lineariser stage may also comprise one or more of the above-described limiters of the respective one or more of the above-described electronic apparatuses.

According to another aspect of the present invention, there is provided a multi-feed, multiple amplifier phased array type antenna system comprising an input stage for receiving a plurality of signal inputs, an output stage for providing a plurality of signal outputs, an amplification stage for amplifying the plurality of signals received at the input stage and providing the plurality of amplified signals to the output stage and one or more of the above-described electronic amplification apparatuses, wherein the amplification stage contains one or more amplifiers of the respective one or more electronic apparatuses.

One or more limiters of the respective one or more amplifiers may be arranged prior to the input stage, or in the amplification stage.

The amplifier system may further comprise a lineariser stage in the amplification stage to improve the linearity of each of the signal paths between the input stage and the output stage, wherein the lineariser stage may also comprise one or more of the above-described limiters of the respective one or more electronic apparatuses.

According to another aspect of the present invention, there is provided a satellite communications system comprising one or more of the above-described electronic amplification apparatuses.

According to another aspect of the present invention, there is provided a satellite communications system comprising one or more of the above-described multiport amplifier systems.

According to another aspect of the present invention, there is provided a satellite communications system comprising one or more of the above-described antenna systems.

Embodiments of the present invention are associated with the benefits of improved DC power efficiency whilst maintaining existing levels of linearity performance without risk of damage to the electronic amplification apparatus.

BRIEF DESCRIPTION OF THE DRAWINGS

Embodiments of the present invention will be described, by way of example only, with reference to the attached figures, in which.

DETAILED DESCRIPTION

Figure 1:
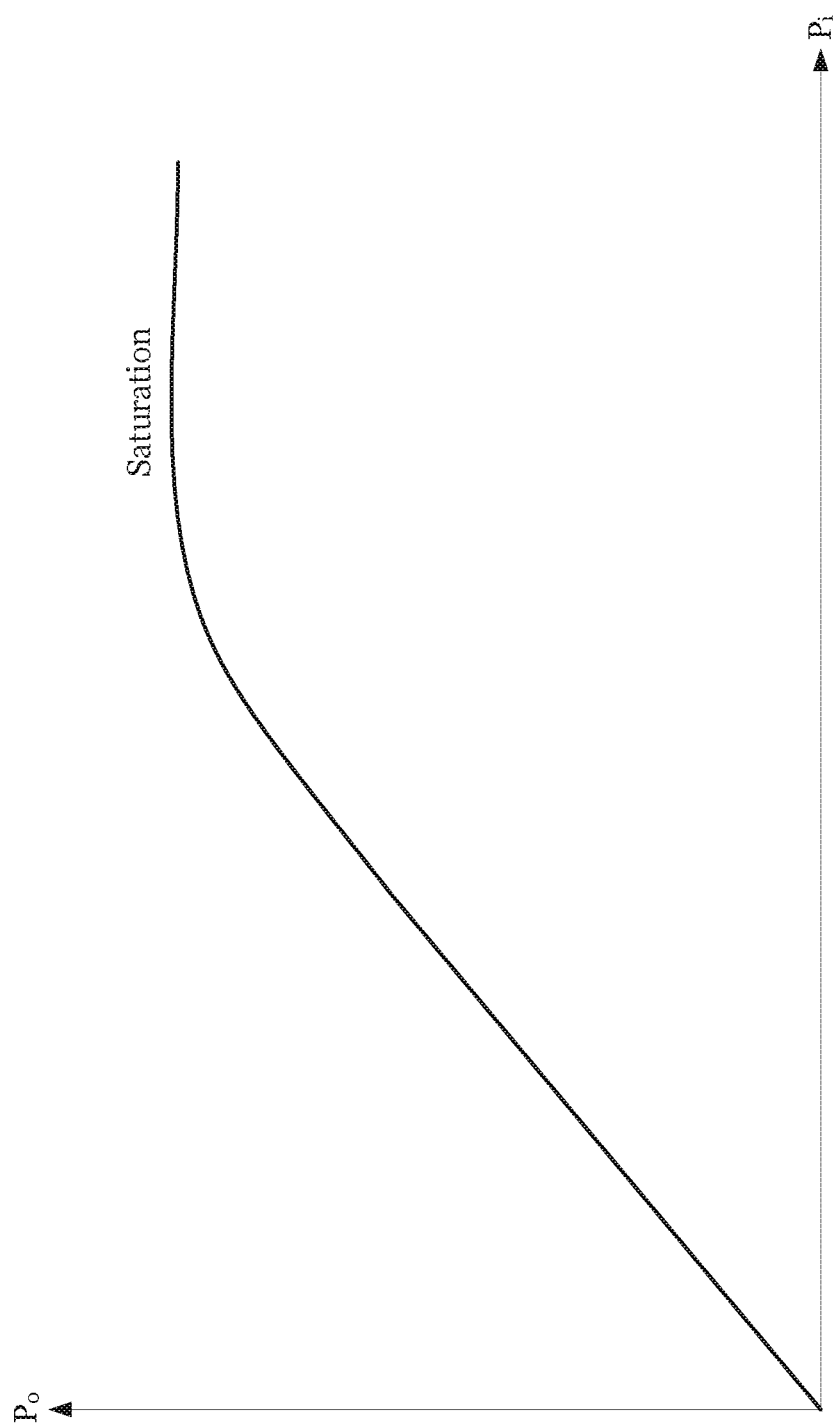
FIG. 1 illustrates a typical power transfer curve for a signal amplifier.
Figure 2:
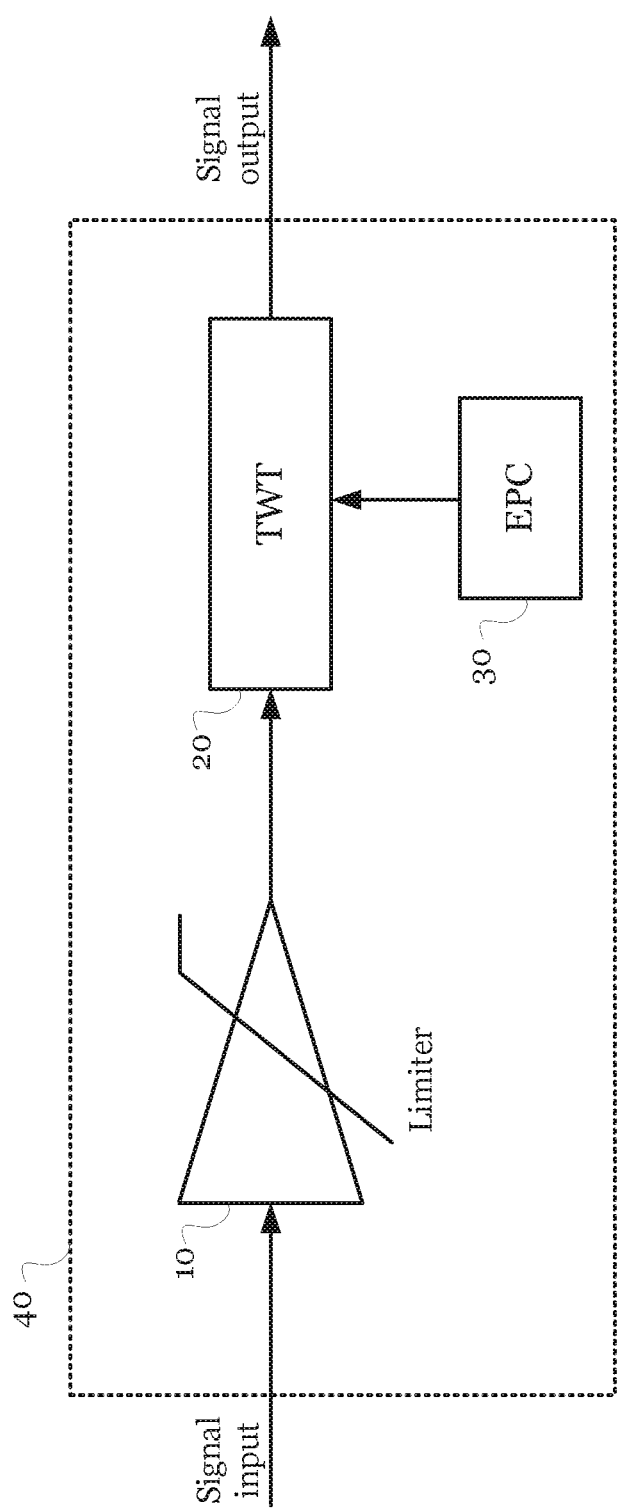
FIG. 2 illustrates an amplifier system according to an embodiment of the present invention.

FIG. 2 illustrates an example of an amplifier system 40 according to an embodiment of the present invention which uses a travelling wave tube (TWT) 20 as the amplifier.

The amplifier system 40 can thus be considered as a travelling wave tube amplifier (TWTA). The construction of a TWT is well known to the skilled person and conventional details thereof are omitted in the interests of conciseness. In summary, a TWT uses power from a high voltage electron beam (for example, 5 kV), generated by an electronic power conditioner (EPC), to increase the amplitude of an input radio frequency (RF) signal via interaction between the electron beam and the RF signal as the RF signal travels through the slow wave characteristics of the tube. As a result of their high performance and wide bandwidth, TWTs are a popular choice in amplifier systems in space applications.

As set out above, TWTs are typically configured so that they are optimised to work at saturation. The configuration of the TWT to achieve this may be carried out in a number of ways, including appropriate control of the EPC and biasing of the tube cathode which provides the electron source for the amplifying electron beam and also the correct biasing of the TWT collector voltages. As configured, these TWTs are less efficient when operated at any back off point below saturation.

In the present embodiment, the TWT 20 is configured to be optimised to work at a lower operating point than saturation, within the linear region of the amplifier. Since the TWT 20 is optimised in this way, it can be considered to have a higher efficiency at the optimised operating point in the linear range, than that which it would have had had it been optimised for operation at saturation, and so this enables signal distortion to be maintained at an acceptable level through operating in the linear region, while avoiding reduction in efficiency associated with operation in backed-off conditions.

As a consequence of such optimisation, the amplifier system 40 of the present embodiment is thus very different from conventional TWT-based amplifiers in that it is purposely not optimised for use at the saturation point. In practice, if the amplifier of the present embodiment were to be operated at saturation, the TWT 20 may in fact be damaged. Consequently, the present embodiment includes a limiter 10 in the amplifier system 40 prior to the TWT 20 to avoid such damage.

The limiter 10 is arranged to restrict the input power to the TWT 20 to ensure that the output power of the TWT does not exceed a predetermined threshold. The threshold may correspond to an operating point beyond which the TWT 20 may be damaged, and may be a point below saturation of the TWT 20.

In combination, the TWT 20, limiter 10 and the EPC 30 enable high efficiency to be achieved with low signal distortion, through preventing the TWT 20 from moving into a higher drive operating point and in doing so, the present embodiment enables efficient operation in the back-off drive cases without risk of damage to the TWT 20.

The TWT 20 is optimised for operation in backed-off conditions, removing the requirement for operation at saturation. Since the TWT 20 is intended for use only in the linear region, the design constraints on the TWT 20 which would otherwise be required to enable operation at saturation are eliminated. Additionally, the extent of the operating range over which the TWT must be capable of functioning is reduced through the restriction to the linear region. Thereby, having relaxed such non-linear operational requirements, it becomes possible to focus on design improvements and tuning improvements of the TWT design as a whole, rather than design considerations required to enable the TWT to operate at saturation.

The EPC 30 is similarly optimised since it reflects the design of the TWT 20, and correspondingly its design focus can be on the control of aspects such as the collector voltage, current or other parameters, in line with the design of the operating parameters of the TWT 20.

Limiters, when used in electronic circuits, conventionally provide "soft" limiter capabilities, in other words they have a slow response time when limiting the slowly changing drive levels that might be achieved when an automatic level control (ALC) system is employed. The limiter 10 of the present embodiment is designed to have a "hard" limiter facility to ensure a fast response to near instantaneous changes in drive level so as to prevent operation about the predefined threshold. The faster the response, the greater the likelihood that damage to the TWT can be avoided.

The amplifier systems described above have a number of advantageous applications. One such application is in a multiport amplifier.

Figure 3:
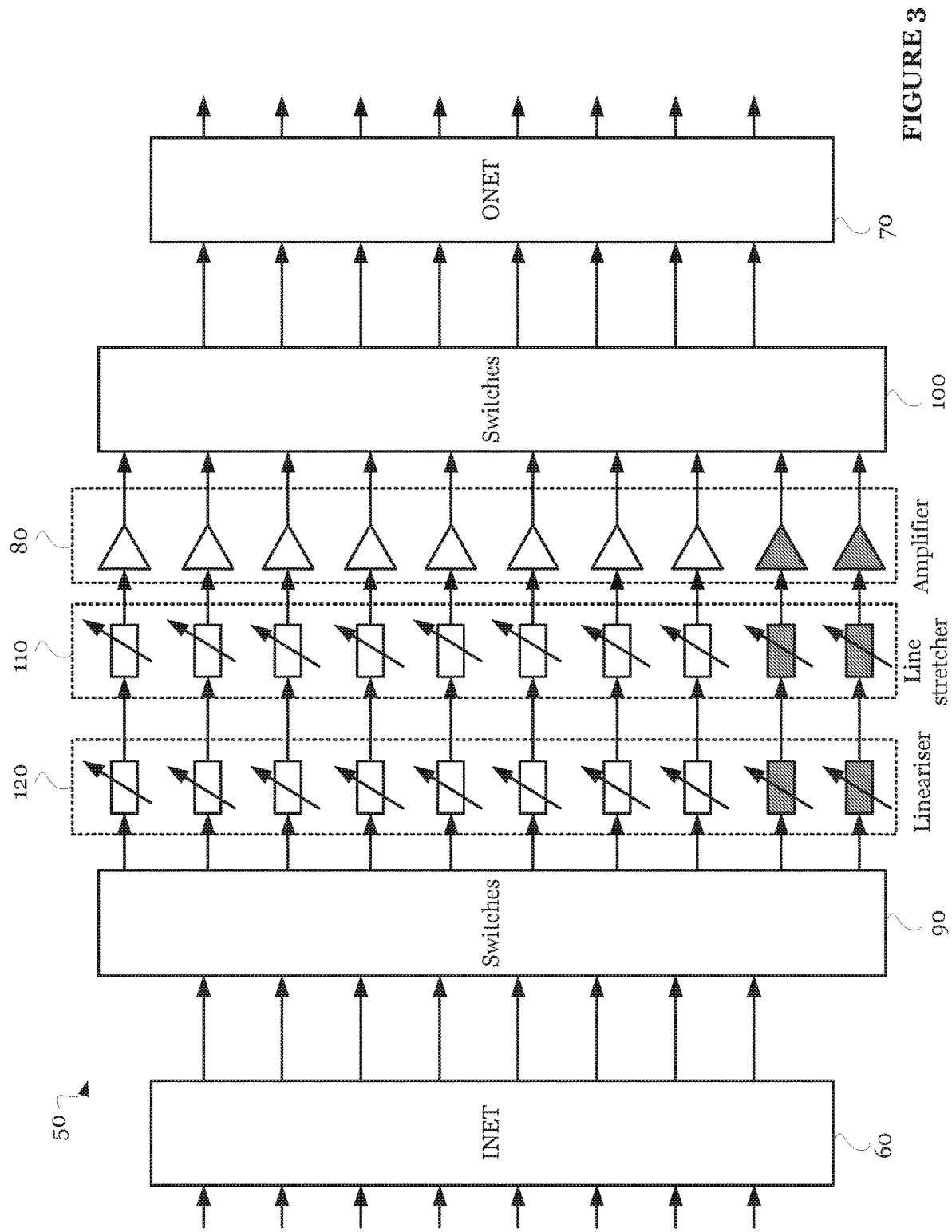
FIG. 3 illustrates a multi-port amplifier according to an embodiment of the present invention.

FIG. 3 shows a multiport amplifier (MPA) 50 according to an embodiment of the present invention. An MPA is a well-known power amplifier device used for communications such as satellite communications, and detailed operation thereof is omitted in the interest of conciseness. MPAs are generally operated at microwave frequencies above 1 GHz, for instance L & S bands with frequencies in the range 1.5 to 2.6 GHz, and Ku & Ka bands with frequencies in the region of 12 to 20 GHz, etc.

An MPA includes N inputs, N outputs, and N amplifier paths arranged as follows. The N inputs pass to an input network (INET), which has N outputs. Typically, the INET is a low power network implemented in any convenient transmission line technology that is appropriate to the circumstances, e.g. microstrip, stripline, coaxial cable, or waveguide. The N outputs from the INET each pass to one of N identical amplifiers, arranged in parallel. The N outputs from the amplifiers each pass to one of N inputs to an output network (ONET) which also has N outputs. The ONET is a high power network typically implemented using low loss transmission line technology.

MPAs are used to allow the total power available from several amplifiers to be used in any or all of several signal paths. For a signal entering at any given MPA input, an output signal is generated at one particular output having been amplified by all N amplifiers. The INET and ONET provide equivalent functionality, and the ONET combines inputs with a certain phase relationship to provide combined power at an appropriate output port.

The MPA 50 shown in FIG. 3 contains eight inputs and eight outputs, and is thus an 8×8 MPA, although the principles of the described embodiment apply equally to an MPA of higher or lower order. Switching networks or matrices 90, 100 can be included at the output of the INET 60 and the input of the ONET 70 to provide required redundancy to meet the required reliability for space applications, but the switching 90, 100 networks are not essential.

Each amplifier path, between the two switching matrices 90, 100, comprises an amplifier 80 which is a TWT amplifier as used in FIG. 2. The term "amplifier" is used for simplicity, and the conventional symbol for an amplifier is used in FIG. 3 to represent this system. After each amplifier 80 may be an isolator and a low pass filter (not shown) to improve isolation between different signal paths and to eliminate noise. Although eight amplifier paths are required for the 8×8 MPA, an additional two amplifier paths are illustrated in FIG. 3 using shaded colouring, which provide redundancy in the event of failure of any of the components of the MPA 50. The redundancy is not essential, but can be beneficial where the MPA 50 is to be used in space. The switching matrices 90 100 can be programmed remotely to adapt to any failure of an amplifier path in order to redirect signals to a new amplifier.

Prior to each amplifier 80, attenuators and line stretchers 110 are used to align each of the electrical paths. In addition, "linearisers" 120 are used to improve linear operation of the MPA 50, reducing distortion and thus enabling the MPA 50 to be operated more efficiently for a given degree of distortion through enabling a higher-power operating point as described above. The attenuators, line stretchers 110 and linearisers 120 provide phase and/or gain control where required, and the variable control is illustrated through the use of the adjustment arrow symbols in FIG. 3. The lineariser aims 120 to apply the inverse of the amplifier gain response to the signal paths so that when multiplied by the amplifier gain, distortion can be reduced through a substantially flat gain response.

Each TWT in the amplifier 80 includes an EPC, but in a variation of the present embodiment, two or more TWT's can share a common EPC.

In the present embodiment, the limiter function of the amplifier system 40 of FIG. 2 is incorporated in the MPA 50 of FIG. 3 in the lineariser 120. The limiter thus serves to prevent an output from the INET 60 which is above a certain threshold from being passed to the TWT, which is optimised for operation below saturation. Since the limiter ensures that the MPA 50 need be designed only for operation within the linear range, and in doing so reduces the extent of the required operating range, the design constraints on the construction of the individual components of the MPA 50 are relaxed, as set out above. The MPA 50 of the embodiment of FIG. 3 can be considered as a "linear-limited MPA".

In a further embodiment of the present invention, the limiter of each amplifier 80 can be positioned outside the MPA 50, i.e. prior to the INET 60, instead of within the lineariser 120. The effect of this is to reduce the level of signals provided to each input of the INET 60.

In the embodiment in which the limiters are positioned inside the lineariser 120, each limiter is a multi-carrier limiter, which is suitable for receipt of signals from any of the INET inputs 60. Consequently, the threshold of the limiter must be set appropriately in conjunction with the design to be used, independent of the source of the multi-carrier signal used.

In a further embodiment of the present invention, the limiter can be incorporated within the EPC instead of in the lineariser 120. Rather than having a direct limiting effect on an RF signal, the limiter instead controls the parameters of the TWTA to prevent damage when TWTA are operated at levels above the nominal operating point. An advantage of this embodiment is that where an EPC is shared among two or more TWTs, the number of limiters can be similarly reduced in comparison with the case where a separate limiter is used for each amplifier path. Since it is not essential for the EPCs and the TWTs to be physically located near each other in a satellite, for example, it may be that there are no spatial constraints on the number of EPCs, and consequently limiters, which are required.

Conventionally, an MPA might include a limiter which prevents use of an operating point significantly exceeding saturation as this can lead to undesirable amplifier performance. Therefore the present invention is unconventional in the sense that it uses a limiter having a significantly lower threshold point than normally used.

In summary, the use of a highly-efficient backed-off (referred to herein as "HEBO") TWTA in an MPA improves direct current (DC) power efficiency, which is conventionally reduced when operating below saturation levels. Improvement in efficiency is a significant advantage in satellite-based applications in which an MPA is used, where the unique environment of the MPA and the availability of power present particular challenges, which leads to the conventional configuration in which amplifiers are operated close to saturation to maximise efficiency. Power usage must be optimised in view of the restriction of power sources to batteries, fuel cells and solar power, while overheating, which could occur with less efficient TWTA.

Another application for the amplifier systems described above and illustrated in FIG. 4 is the multiple-feed, multiple-amplifier phased array-type antenna system.

Figure 4:
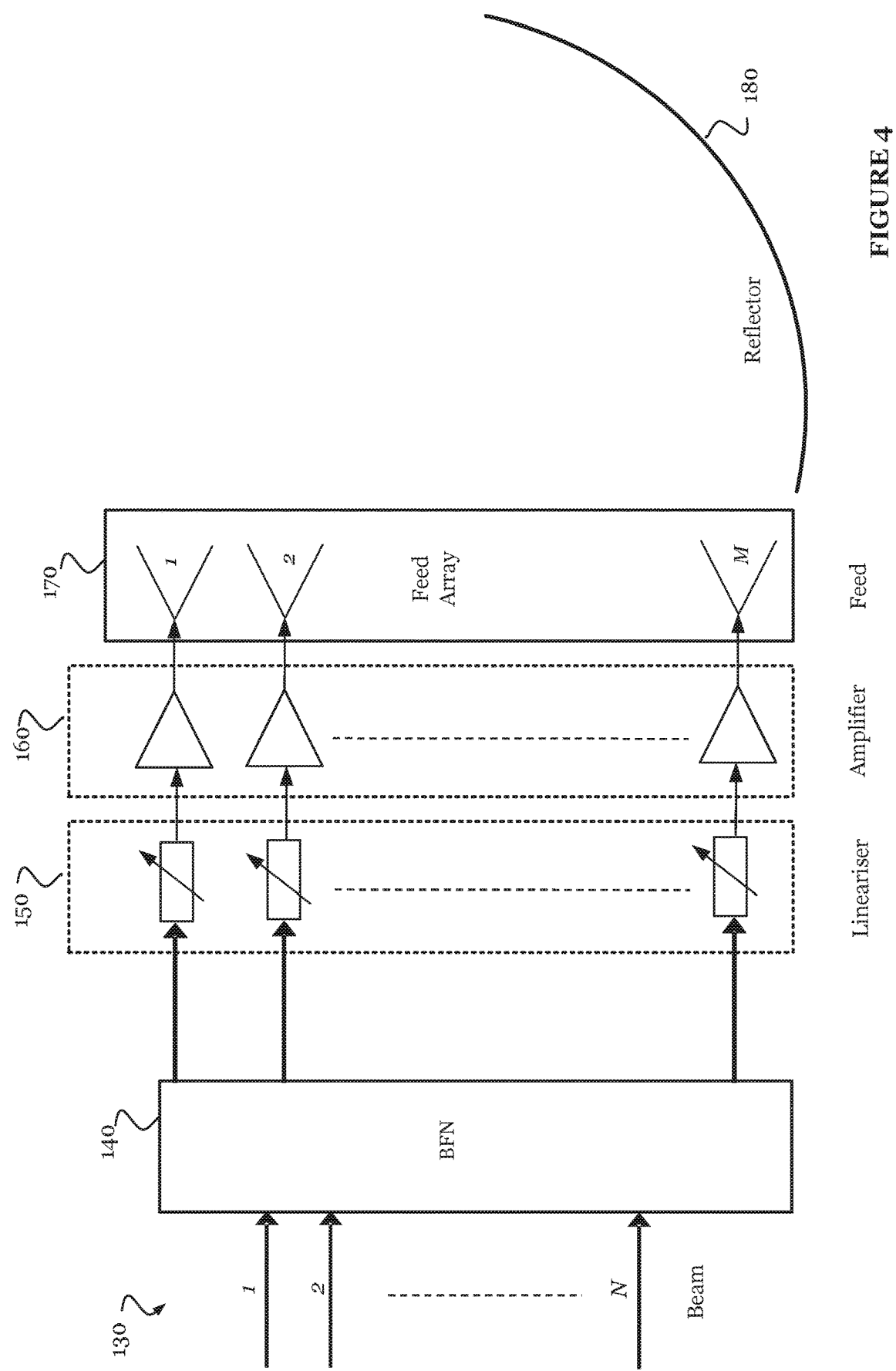
FIG. 4 illustrates a typical multiple feed phased array type transmit antenna system.

FIG. 4 shows an example of one such antenna system in this case an array-fed reflector type system AFR 130 according to an embodiment of the present invention. An AFR is a well-known multiple feed phased array type transmit antenna system used for communications such as satellite communications, and detailed operation thereof is omitted in the interest of conciseness.

An AFR 130 includes N inputs, M outputs, M amplifier paths and M antenna Feeds arranged as follows. The N inputs represent all the signals destined for a particular beam. These signals pass into the beam forming network BFN 140 where they are divided into M equal signals and amplitude and phase beam weights are applied. These signals are added to N similar signals from the other N−1 beam inputs before being outputted on M outputs. Typically and in this instance the BFN 140 is a low power device but in alternative embodiments of the present invention, the antenna system may take the form of a multi-feed phased array using high power beam formers in which case the BFNs are placed after the amplifier paths.

The M outputs from the BFN 140 each pass to one of M identical amplifiers 160 according to the present invention arranged in parallel. Typically a lineariser 150 will be incorporated into the system prior to the amplifier 160. The M outputs from the amplifiers each pass to one of M antenna feed elements contained within the feed array 170 before radiating freely into space via the reflector 180. In alternative embodiments, the antenna system need not use a reflector, and such multi-feed multi-amplifier phased array type systems are commonly known as direct radiating arrays DRA.

In some AFR 130 architectures according to embodiments of the present invention, the number of N beams and M amplifiers can be very large and in these cases and to provide a greater degree of power flexibility the amplifiers are often arranged in groups that form multiport amplifier MPAs themselves. In these cases the MPA outputs provide the inputs to the feed array 170

In the present embodiment illustrated with reference to FIG. 4, the limiter function of the amplifier system 40 of FIG. 2 is incorporated in the AFR 130 of FIG. 4 in the lineariser 150. The limiter thus serves to prevent an output from the BFN 140 which is above a certain threshold from being passed to the TWT, which is optimised for operation below saturation.

In other embodiments of the present invention the limiter can be positioned outside and prior to the AFR 130 or within the EPC of the TWTA 160 in a similar manner and for similar reasons as described for the MPA 50.

Conventionally, an AFR 130 might include a limiter which prevents use of an operating point significantly exceeding saturation as this can lead to undesirable amplifier performance. Therefore the present embodiment is unconventional in the sense that it uses a limiter having a significantly lower threshold point than normally used.

In summary, the use of a highly-efficient backed-off TWTA in an AFR improves direct current (DC) power efficiency, which is conventionally reduced when operating below saturation levels.

In practical terms, the operating point should be in the linear region of the amplifier, but at the highest end of this range at which it is feasible to pass traffic through the amplifier without distortion, and so the nature of the expected signals to pass through the amplifier, and the likely number of frequency components, can be taken into account in determining how close to saturation a suitable operating point should be configured.

The nature of the optimisation of an amplifier for a specific operating point below saturation can be dependent on the intended use of the amplifier. In most situations, the operating point will be dictated by the requirements of a particular mission. Automatic leveling control loops may be useful in such situations in order to maintain a particular operating point.

Figure 5:
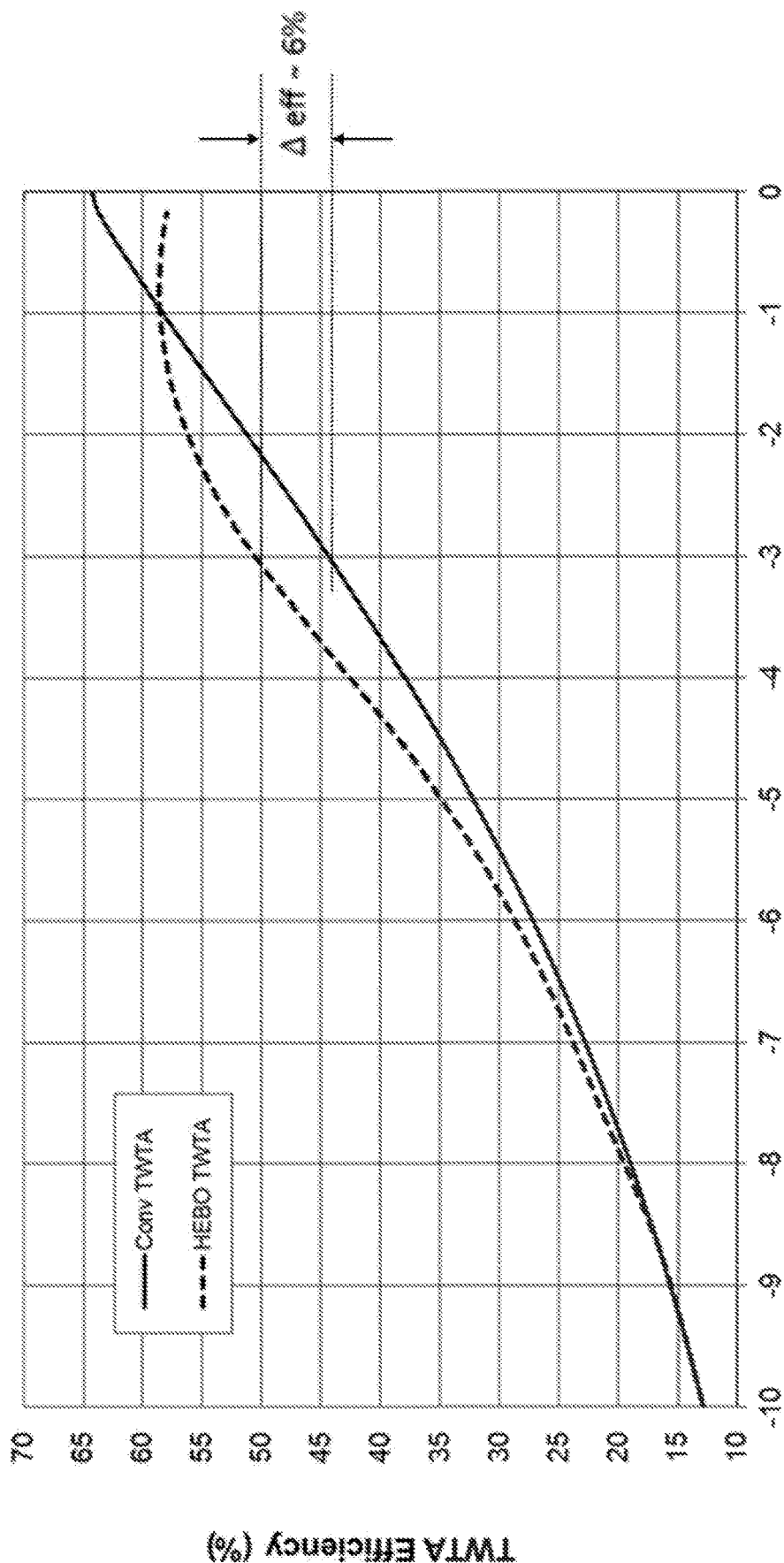
FIG. 5 illustrates a comparison of RF to DC power efficiency for a conventional off-the-shelf amplifier and an amplifier used in an embodiment of the present invention.

To illustrate the benefits of the present invention, FIG. 5 shows a measured RF to DC power efficiency curve for varying operating points expressed as output back-off (OBO), in decibels (dB) for a typical "off-the-shelf" conventional Ku-band (12 GHz) electronic amplifier (TWTA) for space use that has been optimised to operate at saturation. In FIG. 5, this power efficiency curve is labelled as "Conv. TWTA". Also shown (for illustration purposes only) is a hypothetical improved RF to DC efficiency curve for the same TWTA if it had been optimised according to embodiments of the present invention to operate at an operating point of, say, 3 dB below saturation. In FIG. 5, this power efficiency curve is labelled as "HEBO TWTA". The illustration shows that although the efficiency may have significantly reduced in the region of saturation it has improved at the −3 dB operating point by approximately 6%. At satellite level this translates into an approximate 12% reduction in DC power required to achieve the same RF power together with a corresponding reduction in heat dissipation.

The skilled person will appreciate, based on the teaching of the invention, that a number of variations and modifications to the described embodiments are possible which fall within the scope of the invention as defined by the claims, since specific aspects of the optimisation of the amplifier and the selection of an operating point are dependent on a number of factors as described above. Consequently, the described embodiments are not intended to limit the scope of the present invention but are examples of how the beneficial effects of the invention can be achieved. As described above, although efficiency is improved through optimisation of the amplifiers for a particular operating point below saturation, it is also possible to avoid amplifier damage through user of a limiter, while design constraints can be relaxed through restriction to the linear operating range. The skilled person will be able to configure specific limiter operation and optimisations in a way which would be appropriate to a particular application.

The invention claimed is:

1. An electronic amplification apparatus comprising:
a travelling wave tube amplifier (TWTA); and
a limiter;
wherein the TWTA is designed for optimised RF-to-DC efficiency at an operating point below saturation within the linear region of the amplifier, such that the peak RF-to-DC efficiency of the TWTA is within the linear region, and the limiter is arranged to prevent the output power of the amplifier from going beyond a predetermined limit.

2. The apparatus according to claim 1, wherein the limiter is arranged to restrict operation of the amplifier to a point below saturation.

3. The apparatus according to claim 1 wherein the limiter is arranged to limit the power of an input signal to the amplifier to below a predetermined threshold.

4. The apparatus according to claim 1, wherein the limiter is arranged to limit a parameter of the TWTA, or of an electronic power conditioner (EPC) of the TWTA, below a predetermined threshold.

5. The apparatus according to claim 4, wherein the parameter of the EPC is a voltage or current of the EPC.

6. The apparatus according to claim 1, wherein the limiter has near instantaneous response with respect to variations in the input signal to the electronic amplification apparatus.

7. A system comprising:
an input stage for receiving a plurality of signal inputs;
an output stage for providing a plurality of signal outputs;
an amplification stage for amplifying the plurality of signals received at the input stage and providing the plurality of amplified signals to the output stage; and
one or more electronic amplification apparatuses, each of the one or more electronic amplification apparatuses comprising:
a travelling wave tube amplifier (TWTA); and
a limiter;
wherein the TWTA is designed for optimised RF-to-DC efficiency at an operating point below saturation within the linear region of the amplifier, such that the peak RF-to-DC efficiency of the TWTA is within the linear region, and the limiter is arranged to prevent the output power of the amplifier from going beyond a predetermined limit; and
wherein the amplification stage contains one or more amplifiers of the respective one or more electronic apparatuses.

8. The system according to claim 7, in which one or more limiters of the respective one or more amplifiers are arranged prior to the input stage, or in the amplification stage.

9. The system according to claim 7, further comprising a lineariser stage in the amplification stage to improve the linearity of each of the signal paths between the input stage and the output stage, wherein the lineariser stage comprises one or more limiters of the respective one or more electronic amplification apparatuses.

10. The system according to claim 7, wherein the system is a multi-feed, multi-amplifier phased array-type antenna system.

11. The antenna system according to claim 10, in which one or more limiters of the respective one or more amplifiers are arranged prior to the input stage, or in the amplification stage.

12. The antenna system according to claim 10, further comprising a lineariser stage in the amplification stage to improve the linearity of each of the signal paths between the input stage and the output stage, wherein the lineariser stage comprises one or more limiters of the respective one or more electronic amplification apparatuses.

13. The system according to claim 10, further comprising one or more multiport amplifier (MPA) systems, each of the one or more MPA systems comprising:
an input stage for receiving a plurality of signal inputs;
an output stage for providing a plurality of signal outputs;
an amplification stage for amplifying the plurality of signals received at the input stage and providing the plurality of amplified signals to the output stage; and
one or more electronic amplification apparatuses, each of the one or more electronic amplification apparatuses comprising:
a travelling wave tube amplifier (TWTA); and
a limiter;
wherein the TWTA is designed for optimised RF-to-DC efficiency at an operating point below saturation within the linear region of the amplifier, such that the peak RF-to-DC efficiency of the TWTA is within the linear region, and the limiter is arranged to prevent the output power of the amplifier from going beyond a predetermined limit; and
wherein the amplification stage contains one or more amplifiers of the respective one or more electronic apparatuses.

14. The apparatus according to claim 1, wherein the apparatus is a component of a satellite communications system.

15. The multiport amplifier system according to claim 7, wherein the MPA system is a component of a satellite communications system.

16. The antenna system according to claim 10, wherein the antenna system is a component of a satellite communications system.

17. The system according to claim 7, wherein the system is a multiport amplifier (MPA) system.

* * * * *